United States Patent [19]

Hartleroad et al.

[11] 3,918,146

[45] Nov. 11, 1975

[54] MAGNETIC SEMICONDUCTOR DEVICE BONDING APPARATUS WITH VACUUM-BIASED PROBES

[75] Inventors: Ronald J. Hartleroad, Twelve Mile; James P. Grabowski, Carmel, both of Ind.

[73] Assignee: General Motors Corporation, Detroit, Mich.

[22] Filed: Aug. 30, 1974

[21] Appl. No.: 502,233

[52] U.S. Cl. ................ 29/569; 29/203 P; 29/471.1; 29/589; 228/6; 214/1 BE

[51] Int. Cl.² ........................................... B01J 17/00

[58] Field of Search ....... 29/569, 589, 203 J, 203 P, 29/203 V, 471.1; 228/6; 214/1 BE

[56] References Cited

UNITED STATES PATENTS

| | | | |
|---|---|---|---|
| 3,341,030 | 9/1967 | Engels | 214/1 |
| 3,612,955 | 10/1971 | Butherus | 29/589 |
| 3,722,072 | 3/1973 | Beyerlein | 29/589 |
| 3,731,377 | 5/1973 | Muckelroy | 29/471.1 |
| 3,811,182 | 5/1974 | Ryan | 29/589 |

*Primary Examiner*—W. Tupman
*Attorney, Agent, or Firm*—Robert J. Wallace

[57] ABSTRACT

An improved apparatus for simultaneously automatically magnetically transferring a plurality of integrally leaded semiconductor chips to overlying conductive lead frame structures for bonding. The apparatus includes a soft ferromagnetic vertically extending member cooperating with an electromagnet. The vertically extending member supports a soft ferromagnetic web that in turn supports a plurality of soft ferromagnetic cylinder members. A nonferromagnetic portion in a central part of the web concentrates magnetic flux in the cylinder members. Each cylinder member has a vertical cylindrical chamber therein with openings at each end. A soft ferromagnetic probe having an enlarged lower end is slidably mounted in each cylinder member, with its upper end projecting out of the chamber upper opening. A vacuum applied to the upper portion of each chamber allows atmospheric pressure to upwardly bias the probes. A taper on the upper end of the probes facilitates inserting them into a temporary chip carrying template and further concentrates magnetic flux. A strong magnetic force is thus uniformly applied to a plurality of integrally leaded semiconductor chips for improved precision bonding to a lead frame.

2 Claims, 7 Drawing Figures

MAGNETIC SEMICONDUCTOR DEVICE BONDING APPARATUS WITH VACUUM-BIASED PROBES

BACKGROUND OF THE INVENTION

This invention relates to an improved apparatus for simultaneously transferring a plurality of integrally leaded semiconductor device chips to conductive lead frame structures for bonding thereto. More particularly, it involves an improvement which increases productivity of the inventions described and claimed in U.S. Ser. No. 458,004, entitled "Air-Biased Probe for Semiconductor Device Bonding," Hartleroad et al, filed Apr. 2, 1974, which has the same inventors and assignee as the present invention.

In our U.S. Ser. No. 458,004, now U.S. Pat. No. 3,887,998, which is a continuation-in-part of U.S. Ser. No. 414,521, filed Nov. 9, 1973, now abandoned, there is disclosed an apparatus for automatically magnetically aligning integrally leaded semiconductor device ships with conductive lead frame structures for bonding. In the apparatus of that application, the semiconductor chips are placed one each into a plurality of recesses in one surface of a chip carrying template. Each chip has soft ferromagnetic integral leads on one face thereof. Each template recess has an opening extending up to it from the bottom of the template. A soft ferromagnetic conductive lead frame supported on the surface of the template has a plurality of finger sets, with one finger set overlying each chip. An elevatable magnetic transfer apparatus below the template has an upwardly extending soft ferromagnetic probe for successive insertion in each template recess opening. The probe is slidably mounted within a chamber and upwardly biased by air pressure applied to the bottom of the chamber. The transfer apparatus is raised to insert a probe into a template recess opening and to engage the chip in that recess. As the transfer apparatus is further vertically raised, the probe raises the chip out of the recess into close proximity with its respective overlying lead frame finger set. A magnetic force from the transfer apparatus is transmitted through the probe to raise the chip up off the probe to the lead frame finger set, and to automatically orient the chip therewith. The transfer apparatus is raised further until the probe reengages the backside of the chip to hold it in register with fingers of the lead frame finger set. A hot gas blast is used to bond the chip to the finger set. Excessive elevation of the transfer apparatus is compensated by the regression of the probe into its chamber against the air pressure applied to it. A predetermined force is thus applied to the chip bottom so that the chip-finger registration is not disturbed by the hot gas blast, yet the probe force does not overstress the lead frame fingers. Air escaping from the chamber around the probe provides an air bearing effect for the probe but tends to disturb alignment. A deflection plate on the probe deflects escaping air away from the bonding site.

In the present invention we have discovered an even more effective way of obtaining uniform precision alignment and chip back up. Magnetic flux applied to the chips is increased and escaping air effects are obviated.

OBJECTS AND SUMMARY OF THE INVENTION

Therefore, it is an object of this invention to provide an improved apparatus for more consistently and reliably bonding a plurality of integrally leaded semiconductor device chips simultaneously to corresponding fingers in an overlying lead frame.

These and other objects of the invention are achieved by placing a semiconductor device chip in each of a plurality of recesses in one surface of a chip-carrying template. The chips have soft ferromagnetic integral leads on one face thereof. Each template recess has an opening extending up to it from the bottom of the template. A soft ferromagnetic conductive lead frame supported on the template has finger sets overlying the chips in the recesses. An elevatable magnetic transfer apparatus below the carrier has a soft ferromagnetic vertically extending member for receiving a probe holding device. The probe holding device has at least two vertically oriented soft ferromagnetic cylinder members. A soft ferromagnetic web interconnects the cylinder members. A centrally located nonferromagnetic portion in the web concentrates magnetic flux in each cylinder member. Each cylinder member has a vertical cylindrical chamber therein. A bore extends vertically down from the upper ends of each cylinder member to the top of the chambers. A soft ferromagnetic probe is slidably mounted in each bore. The upper ends of the probe extend above the upper end of the cylinder member. The probe is tapered at its upper end to facilitate insertion into the template openings and to further concentrate the magnetic flux. The lower end of the probe extends into the cylinder member chamber. A nonferromagnetic collar on the lower end of each probe within the chamber serves as a piston. A port in the upper portion of the chamber above the piston is connected to a vacuum source. An opening in the chamber below the piston exposes the lower portion of the chamber to ambient pressure. The probes are thus upwardly biased on a cushion of air without disturbing the chips during the alignment and bonding process. The transfer apparatus is raised to insert each probe into adjacent template recess openings and engage the chip therein. As the transfer apparatus is further vertically raised, the probes raise each chip from their template recesses into close proximity with its respective overlying lead frame finger set. A magnetic force from an electromagnet surrounding the vertically extending member is transmitted through each probe to raise each chip up off its probe to its corresponding lead frame finger set and automatically orient it therewith. The probes are then raised further to reengage the chips. After reengagement, a hot gas blast is used to bond the chips simultaneously to the finger set.

DESCRIPTION OF THE PREFERRED EMBODIMENT

Figure 1:
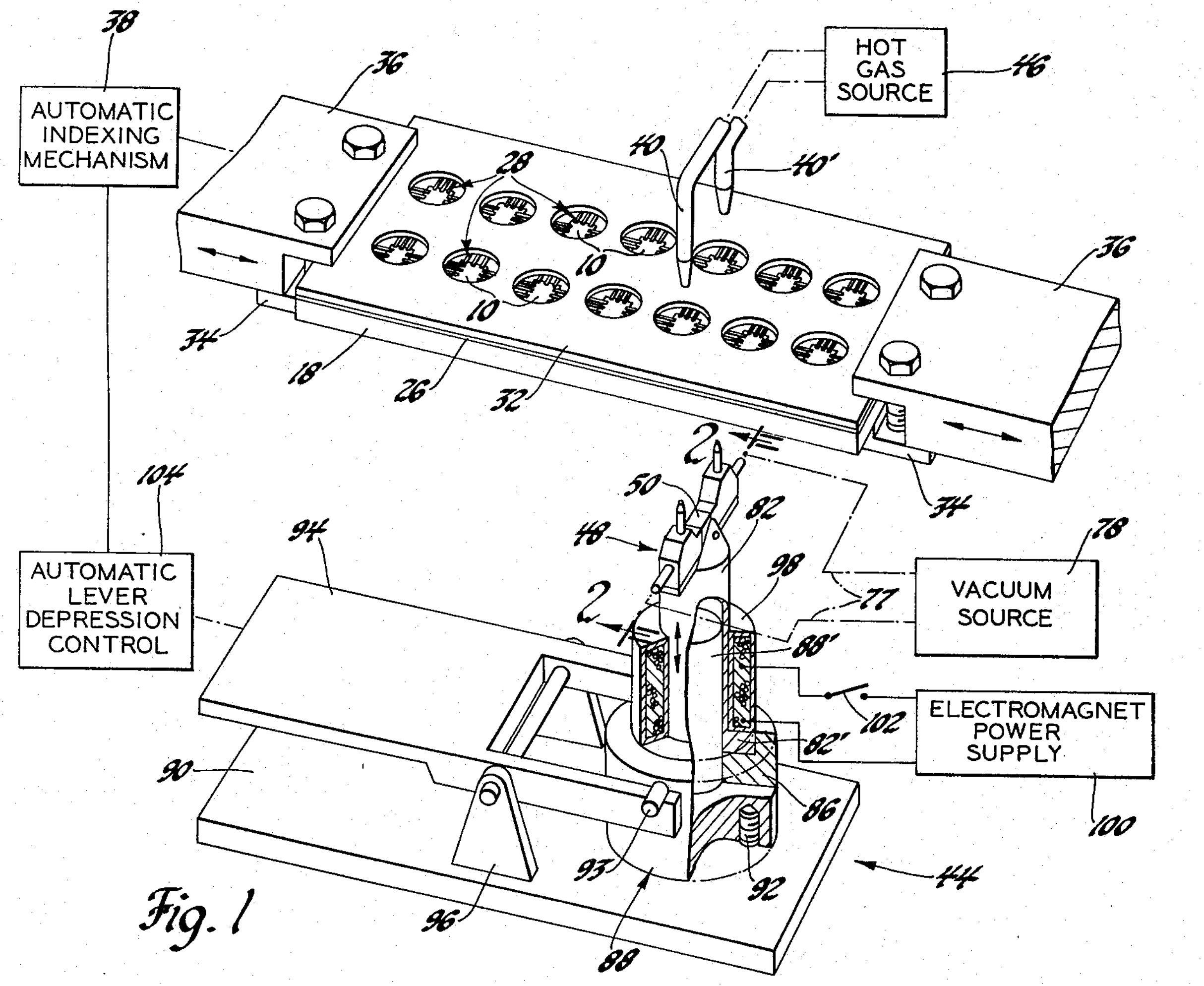
FIG. 1 shows an isometric view with parts broken away of an apparatus made in accordance with this invention.
Figure 2:
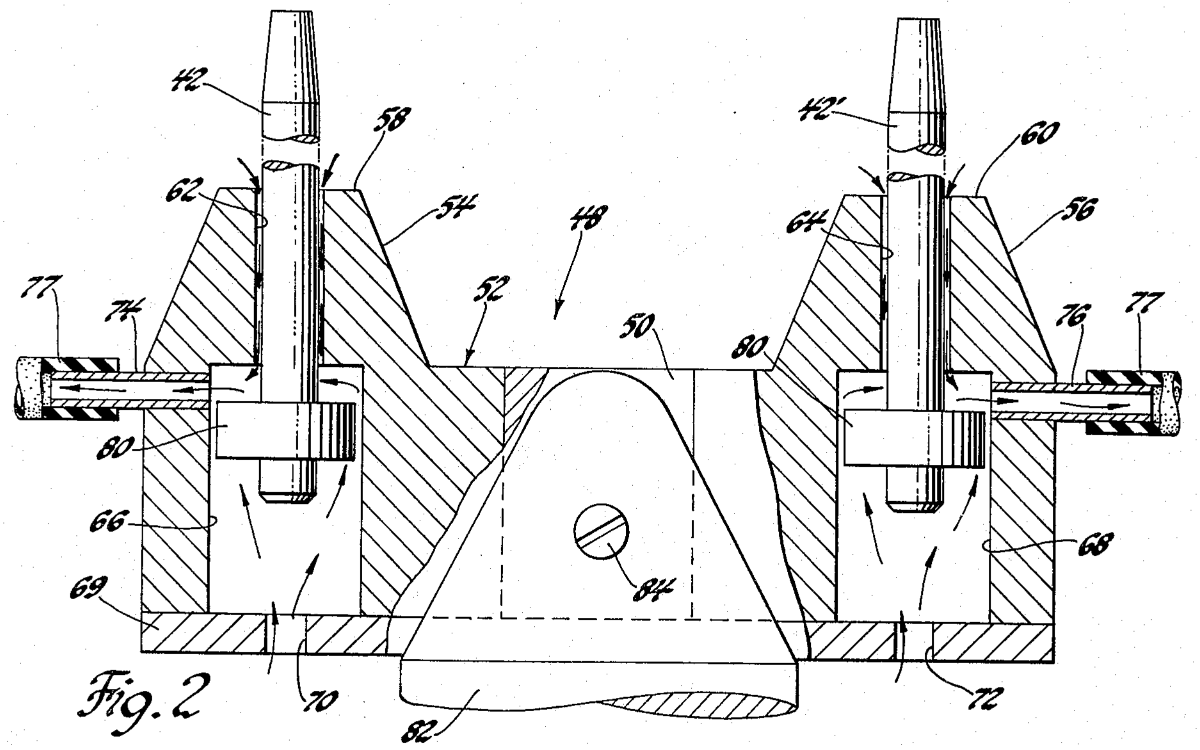
FIG. 2 shows an enlarged fragmentary sectional view in partial elevation of the apparatus along the lines 2—2 of FIG. 1.

Referring now to the drawings, flip chips 10 and 10′ are silicon semiconductor integrated circuit device dies approximately 38 mils square and 11 to 13 mils thick between its two major faces. Each flip chip 10 and 10′ has a dozen spaced apart contact bumps 12 on its upper major face equally spaced about its periphery. Each individual contact bump is approximately 0.75 – 0.85 mils high and 3.8 mils square. For ease of illustration the contact bumps are shown enlarged with respect to the chip. Contact bumps are a composite of successive layers of aluminum, chromium, nickel, tin and gold, with the outermost layer being gold to permit making a eutectic bond with a gold plated lead frame. While the foregoing bump construction is preferred, it can be varied. However, the nickel content should be at least about 30 and preferably about 60% by volume of the total contact bump volume, as is the case in this example.

As described in U.S. Ser. No. 414,274, "magnetic Alignment for Semiconductor Device Bonding," Hartleroad et al, filed Nov. 9, 1973, now U.S. Pat. No. 3,887,997, the nickel content provides a low reluctance path by which magnetic flux lines can easily pass through the contact bumps. The greater than 30% by volume nickel in effect gives the contact bumps characteristics of a soft ferromagnetic material. By soft ferromagnetic material, we mean a material having a high overall permeability and a low residual magnetization, with a low coercive field required. It should be noted that although nickel has been found to be the most practical metal to be used in production, other metals such as soft iron may be substituted therefor. However, if so, different volumes may be preferred.

Each of the flip chips 10 is situated in a recess 14 within a major surface 16 of template 18. Template 18 serves as a temporary semiconductor chip carrier and has two major parallel surfaces 16 and 20. Template 18 is a rigid body of stainless steel which is approximately 10½ inches long, 3½ inches wide, and 3/32 inch thick. The recesses 14 are located in spaced rows and columns within the template surface 16 and have bottom portions 22 which are substantially parallel to the major surfaces of the template. Each recess 14 has a cylindrical opening 24 extending from the bottom portion 22 to template surface 20. Template 18 can be laminated, as described in U.S. Ser. No. 414,501, "Laminated Template for Semiconductor Device Bonding," Hartleroad et al, filed Nov. 9, 1973, now U.S. Pat. No. 3,868,765.

A conductive lead frame 26 rests on the upper surface of template 18 and is aligned therewith. Lead frame 26 is of a soft ferromagnetic material such as Alloy 42 and has a thin layer of gold (not shown) on both of its major faces. Alloy 42 is an alloy containing, by weight, about 41.5% nickel, 0.05% carbon, 0.5% manganese, 0.25% silicon, and the balance iron. Lead frame 26 has a length and width approximately the same as that of template 18 and has a thickness of about 25 mils. Lead frame 26 has a plurality of sets 28 of mutually spaced inwardly convergent cantilevered fingers 30, with the sets being spaced from each other and arranged so as to correspond to template recesses 14. The fingers in each set have free inner ends 30′ arranged in a predetermined pattern which corresponds to the pattern of contact bumps 12 on semiconductor flip chip 10 below it.

A cover plate 32 on the top side of the lead frame holds the lead frame against the top of the template 18. Cover plate 32 is generally coextensive with the lead frame 26 and is constructed of SAE 300 series stainless steel. Cover plate 32 has a plurality of circular openings therein, with one opening concentric each set 28 of the lead frame fingers. It should be noted that deviations in template-lead frame-cover plate planarity and parallelism are not shown in the drawings. Instead, in FIGS. 3 – 7 chips 10 and 10′ of exaggerated different thicknesses are shown in adjacent template recesses 14 and 14′ to better illustrate how our apparatus can accommodate such problems.

The template 18, lead frame 26, and cover plate 32 are held together in mutual registration by means of clamps 34 on the ends of arm 36 as can be seen in FIG. 1. The arms 36 are connected to supporting automatic indexing mechanism 38 as shown in FIG. 1. The automatic indexing mechanism 38 successively positions template-lead frame subassemblies so that openings 24 and 24′ of adjacent template recesses 14 and 14′ are vertically aligned between the outlets of hot gas tubes 40 and 40′ and the probes 42 and 42′ of transfer apparatus 44. The hot gas tubes 40 and 40′ are connected to a source 46 as shown in FIG. 1. It should be noted that while the hot gas tubes are shown stationary in FIG. 1 for convenience, they can be movable.

Particular attention is now drawn to the probe holder assembly 48, which as support portions essentially the same as that disclosed and referred to as the transfer apparatus in U.S. Ser. No. 414,274, now U.S. Pat. No. 3,887,997. It should be understood that due to the extremely small size of the semiconductor devices that the apparatus shown in these drawings are not in proportion with the small size of the flip chips and must out of necessity for clearness be shown smaller than in reality. Hence, reference to the dimensions given throughout this application should prove helpful in visualizing true proportion.

The probe holder assembly 48 has two horizontally spaced and vertically oriented cylinder members 54 and 56. The cylinder members 54 and 56 are constructed of a soft ferromagnetic material such as hot or cold rolled steel. It should be noted that the precise horizontal cross-sectional shape of cylinder members 54 and 56 may be varied. That is, they may also be circular, hexagonal, etc., as well as rectangular in crossection. However, they should be elongated in the vertical direction for optimum magnetic flux concentration.

The cylinder members are connected by a web 52 which conforms to the slot in the transfer apparatus so that it can be mounted thereon. The web 52 has a brass divider 50 which separates the two soft ferromagnetic cylinder members. The brass is a nonferromagnetic material and divides the magnetic flux transmitted from the support portions and concentrates them uniformly in each of the cylinder members 54 and 56. The divider 50 has the same height and thickness as web 52 and is about ⅛ inch in length in this example. However, we have discovered that it may be from 0.031 – 0.20 inch wide for a spacing of 0.4 inch between each probe. That is, the length of divider 50 should be between 13 – 50% of the spacing between probes 42 and 42′ for optimum results. The cylinder members 54 and 56 have tapered upper end portions 58 and 60, respectively, which are spaced apart approximately the distance between the recesses 14 and 14' of template 18. Cylinder members 54 and 56 have cylindrical bores 62 and 64 which extend from their tapered upper ends 58 and 60 down to the top of chambers 66 and 68, respectively. The bores 62 and 64, in this example, have a diameter of about 41 – 42 mils and are spaced apart about 0.4 inch so that they are concentric with openings 24 and 24' in the template 18.

The chambers 66 and 68 are preferably cylindrical, being about ½ inch long and ⅛ inch in diameter. By the term cylindrical, we mean to include those shapes having uniform cross-sections, including hexagonal, octagonal, etc., shapes, as well as circular. A base plate 69 is secured to the bottom of assembly 48 with silver solder or epoxy to form an imperforate air seal therebetween. Two openings 70 and 72 in the base plate 69, concentric with chambers 66 and 68, provide means for opening the lower portion of chambers to the ambient or atmospheric pressure. Preferably, the openings have a diameter of the order of 1/16 inch. Two vacuum ports 74 and 76 extend horizontally from the upper portion of chambers 66 and 68. It is important to note that the vacuum ports must be located at least in the upper ¼ portion of the chambers. In this example, the center line of the vacuum ports is spaced about 3/32 inch from the top of the chambers. The vacuum ports have an inside diameter which is about 1/16 inch. Preferably, the diameter of openings 70, 72 should be between 1/64 – ⅛ inch for a vacuum port inside diameter of 1/16 inch. The vacuum ports 74, 76 are connected by flexible tubing 77 to a vacuum source 78. Preferably, vacuum source 78 provides a vacuum, low pressure, of about 20 inches of mercury (Hg).

Probes 42 and 42' are slidably mounted within bores 62 and 64. As can be seen in the drawings, probes 42 and 42' have a length which is longer than that of bores 62 and 64. Consequently, the upper end of probes 42 and 42' extends upwardly above its respective cylinder member and the lower end of the probes extend into its respective chamber.

The probes are constructed of a soft ferromagnetic material, such as soft iron. The major diameter of the probe is about 40 mils which provides strength and rigidity for the major part of the probe. The probe is tapered at its upper end to provide a tip having a diameter of 32 mils. This taper begins approximately ⅛ inch from the probe tip and provides a selfguiding feature for entry into the small template openings 24 as can be seen in the drawing. Therefore, if the spacing between the adjacent openings 24 and 24' is not precisely uniform throughout the template 18, the tapered end of the probe will abut the wall of the opening and guide the probe into engagement with the chip. The tapered ends for the probes 42 and 42' also cooperate with divider 50 to further concentrate the magnetic flux lines in the area of the chip contact bumps 12.

A brass collar 80 surrounds the lower end of each of the probes 42 and 42' below vacuum ports 74 and 76. The collar 80 is press fit around the probes. It should also be noted that the brass comprising the collar is substantially nonferromagnetic. Hence, the collar will not be attracted to the soft ferromagnetic housing when the magnetic field has been applied. Collar 80 provides a piston-like surface so that air drawn from openings 70, 72 into the chamber vertically biases the probes. Thus, the probes effectively float on a cushion of air. That is, when the vacuum source 78 is applied to vacuum ports 74 and 76, air is drawn primarily from openings 70, 72 as indicated by the arrows in the drawings. Note also that a small amount of air is drawn in through bores 62 and 64, around the probes 42 and 42' therein. However, it is not enough to create convection air currents which may disturb the flip chips 10 and 10'. This in effect creates an air bearing which automatically centers the probes in their respective bores and eliminates the need for close tolerances therebetween.

While the probes are biased on a cushion of air, no forces air escapes from the bores 62 and 64. Instead, a small amount of air is drawn into the chambers to create the air bearing effect as can be seen in the drawings. Hence, substantial flexibility of the probe tension can be created merely by adjusting the strength of the vacuum. But more importantly is that the probes can be biased without any forced air being blown against the flip chips which may disturb consistent precision alignment of the contact bumps 12 and the lead frame fingers 30. Thus, this vacuum biasing scheme cooperates with divider 50 and the tapered upper ends of probes 42 and 42' to insure more consistent precision magnetic alignment. The divider 50 and tapered probes promote uniform magnetic flux for better chip alignment, while the vacuum biasing scheme prevents disturbance of the alignment once it is made.

The probe holder assembly 48 is mounted in a vertical slot in the top of the probe holder 82 by screw 84 so that the probes extend substantially vertically therefrom. As described in U.S. Ser. No. 414,274, now U.S. Pat. No. 3,887,997, the probe holder 82 is constructed of a soft ferromagnetic material and has a lower flange portion 82' which is seated within a groove on the upper surface of an elevator base 86. The major longitudinal portion of probe holder 82 and the elevator base 86 have a concentric longitudinal cylindrical opening to receive the cylindrical upper end of 88' of base guide 88. The probe holder and elevator base are fitted around the base guide end 88' so that they slide easily vertically therealong without substantial horizontal deviation. The base guide 88 has a flange protion at its lower end which is secured to an aluminum mounting plate 90 as by screws 92. The upper surface of the base guide flange serves as a seat for the lower end of elevator base 86. Elevator base 86 has two oppositely disposed and radially extended bosses 93 which rest on a yoke portion of lever arm 94. Lever arm 94 is pivotally mounted to fulcrum 96 which is attached to mounting plate 90.

An electromagnet coil 98 encircles the periphery of the probe holder 82. The coil 98 is 1⅛ inches long and is constructed of No. 36 gauge enamel copper wire, 63 turns long and 10 turns deep. Coil 98 in conjunction with the probe holder 82 froms an electromagnet. The coil is series connected to a power supply 100 through a switch 102. Preferably, theh power supply supplies an average of 15 volts and 0.45 ampere.

An automatic lever depression control 104 provides a downward force to the lever arm 94 to raise the probe assembly 48 and rigidly connected members of the transfer apparatus. The automatic lever depression control 104 coacts with the automatic indexing mechanism 38 so that the lever arm 94 is slowly depressed at selected intervals as will later be understood. It should be noted that the lever arm can be depressed manually. Even so, there is not need for manual compensation of probe lift between the various bonding sites due to lead frame nonplanarity, differences in chip thickness, etc.

Figure 3:
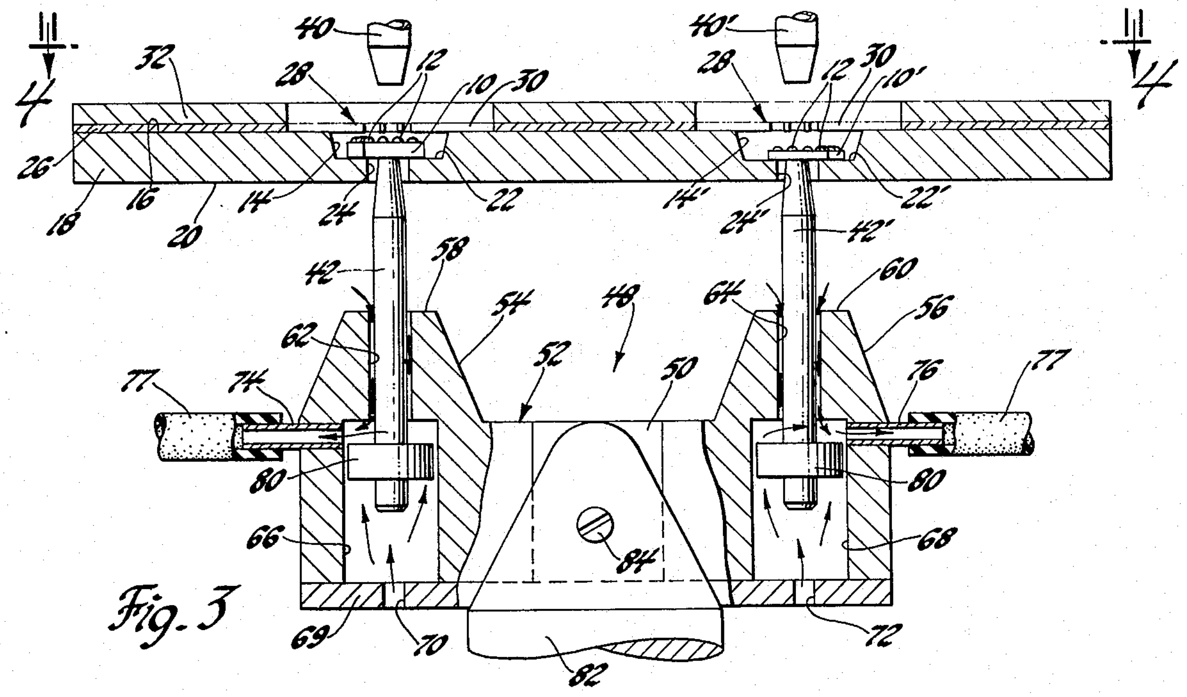
FIG. 3 shows a view of the apparatus shown in FIG. 1 engaging the backside of two semiconductor chips.
Figure 4:
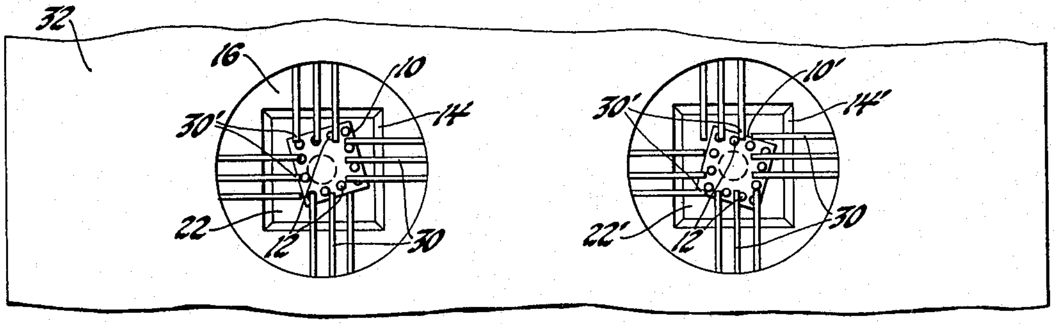
FIG. 4 shows a top plan view along the lines 4—4 of FIG. 3.

The operation of the apparatus of this invention will now be briefly described. The automatic indexing mechanism 38 positions the template 18 in the direction of arrows of FIG. 1 so that the openings 24 and 24' of adjacent recesses are vertically aligned between the hot gas tubes 40, 40' and probes 42, 42'. As can be seen in FIGS. 3 and 4, the flip chips 10 and 10' within the template recesses will probably be slightly misaligned with their overlying corresponding set of lead frame fingers 30.

Figure 5:
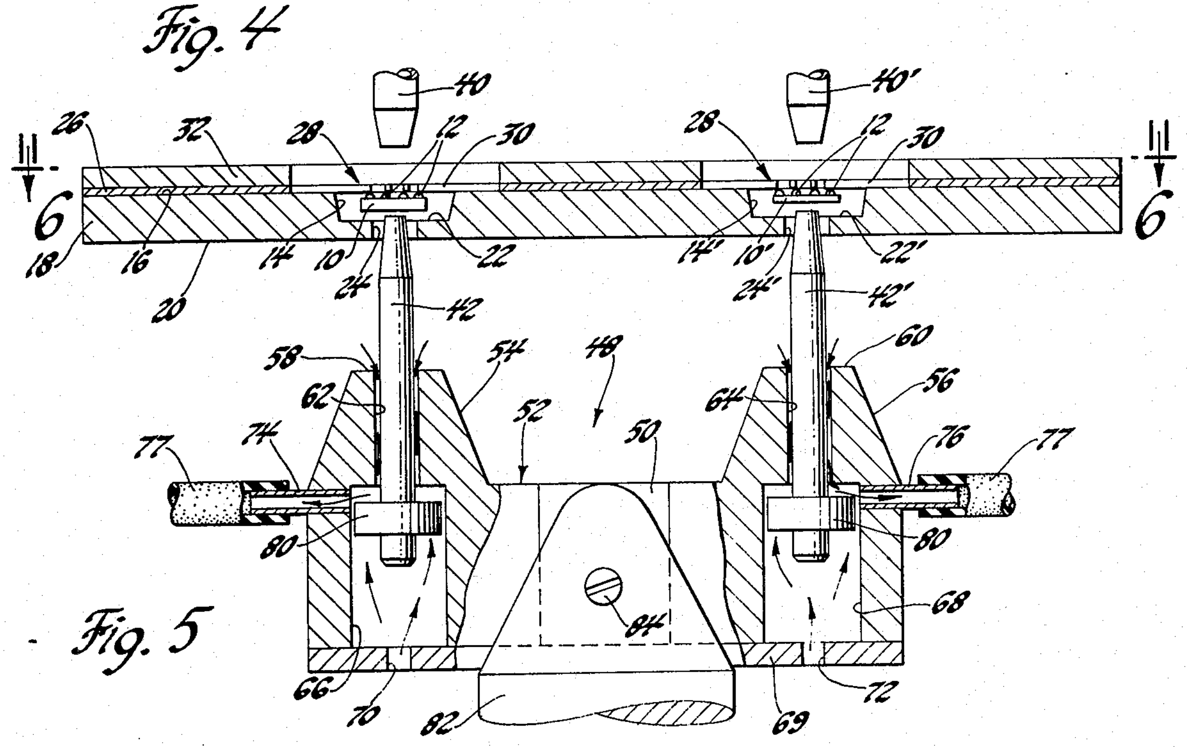
FIG. 5 shows a view of the apparatus shown in FIG. 1 after chip transfer to a lead frame.
Figure 6:
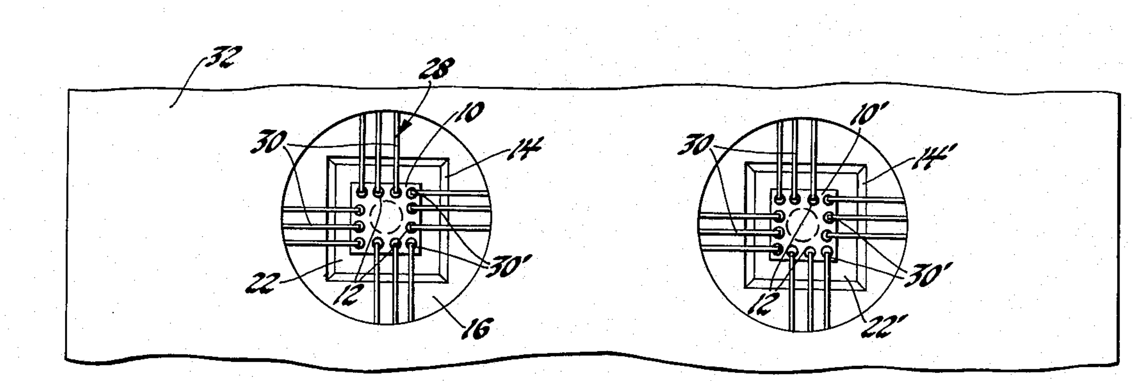
FIG. 6 shows a top plan view along the lines 6—6 of FIG. 5.

After the probes 42, 42' and adjacent template recess openings 24, 24' are aligned, switch 102 is closed to energize the electromagnet coil 98. The lever arm 94 is slowly depressed by activation of the automatic lever depression control 104 to raise the transfer apparatus so that the biased probes enter the adjacent recess openings to engage the backsides of the chips therein as can be seen in FIG. 3. If the probes 42 and 42' are not precisely aligned concentric with openings 24 and 24' the tapered ends of the probes will abut the walls of the openings and guide the probes into engagement with the flip chips. Further depression of lever arm 94 causes the probes to lift the chips off of the template recess bottom portions. The probes carry the chip within close proximity of their overlying sets of lead frame fingers 30. When each chip is brought close enough to the underside of the fingers, the magnetic force transmitted through probes 42 and 42' from the electromagnet coil 98 propels the chips the rest of the way to the underside of its respective set of fingers 30, as can be seen in FIG. 5. In moving from the probe toward the fingers, the chips are also concurrently automatically oriented by mangetic flux lines concentrated in the lead frame fingers in the chip contact bump so that when the contact bumps engage their respective fingers they are precisely aligned therewith, as shown more clearly in FIG. 6.

Figure 7:
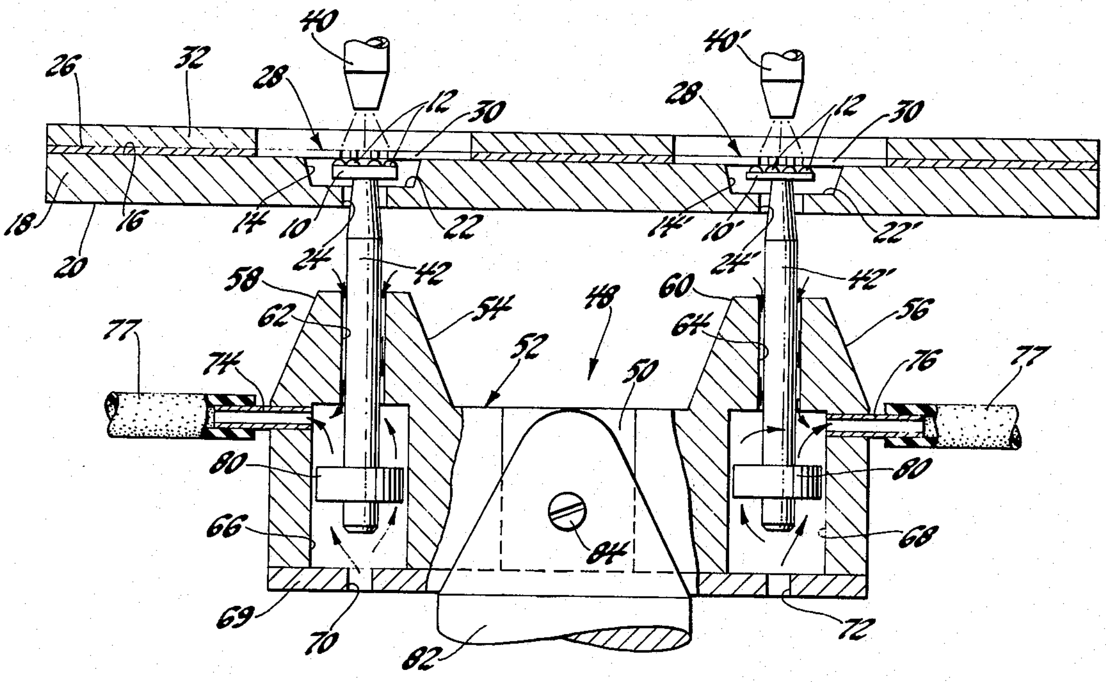
FIG. 7 shows a view of the apparatus shown in FIG. 1 reengaging the backside of the chips.

Further, depression of the lever arm 94 vertically raises the probes 42, 42' so that they reengage the backside of the chips 10, 10' that are already in aligned engagement with their corresponding lead frame fingers. Since in this example flip chip 10 is shown thicker than flip chip 10', the probes 42, 42' will not reengage their respective chips simultaneously. Probe 42 will reengage its chip 10 before probe 42'. Continued upward movement of the probe assembly 48 then produces reengagement of probe 42' with its chip 10'. In the meantime, the first probe 42 is free to regress within its chamber, against a predetermined back pressure of air. On continued upward movement of the probe assembly 48, to insure positive reengagement of both chips, the second probe similarly regresses within its chamber. Thus, in normal operation, as can be seen in FIG. 7, both probes 42 and 42' partially regress within their chambers once they have reengaged the backside of their chips. The back pressure of air applied to the probe by the sucking of air from openings 70, 72 through the vacuum ports 74, 76 is only sufficient to provide effective chip support during the blast of hot gas for bonding. However, it is insufficient to significantly elevate the chip further. Hence, the probes do not upwardly bend the lead frame fingers 30 after reengaging the chips, as would be the case if the probes were rigidly mounted.

Once the chips have been magnetically aligned and the probes have reengaged the chips to hold them in register, the chips are simultaneously permanently bonded to the lead frame by hot gas from the hot gas tubes 40 and 40'. The hot gas is supplied from hot gas source 46 which typically provides a nitrogen and hydrogen gas mixture at a temperature of approximately 500° C. Since the probes are holding the chips in register against their corresponding lead frame fingers, the force from the hot gas blast will not disturb the precision alignment, even if the flast is accelerated to increase the speed of bonding. The hot gas melts the tin in the contact bumps, and the gold outer surfaces of the contact bumps and fingers dissolve in the tin to form a melt. The hot gas is then removed and the melt resolidified to form a permanent electrical and mechanical connection between the chip contact bumps 12 and the lead frame fingers 30.

The precise theoretical explanation of the magnetic alignment process as described in this invention has not been fully ascertained. However, a general theory is that magnetic flux is transmitted from the electromagnetic coil 98 through probe holder 82. The magnetic flux is further longitudinally transmitted through the soft ferromagnetic probes and concentrated in the contact bumps which are also soft ferromagnetic. The soft ferromagnetic fingers of the lead frame provide the path of least reluctance for the magnetic flux lines emerging from the contact bumps. Hence, the contact bumps are attracted to their corresponding lead frame fingers thus causing the chips to jump to and orient themselves with the fingers.

We have discovered that by placing a nonferromagnetic divider 50 between the cylinder members 54 and 56, even more consistent precision alignment will be promoted during simultaneous alignment of two chips in adjacent template recesses. It is believed that the magnetic flux on its return path to the magnetic source may interfere with the flux concentration in an adjacent template recess. By providing a nonferromagnetic divider between the two masses of soft ferromagnetic cylinder members the magnetic flux will return through the same probe and cylinder from which it was transmitted so as not to interfere with the flux concentration in the adjacent recess. Hence, the flux concentration during chip alignment in one template recess will not be affected by the return path of flux from the adjacent recess. The divider 50 also serves to divide the forward path of the magnetic flux lines from the coil 98. In such manner, the flux lines emerging from the coil 98 are concentrated in each of the cylinders 54 and 56, which in turn transmit the flux lines to probes 42 and 42'. The tapered upper end of probes 42 and 42' even further concentrate the forward path of flux lines in the contact bumps 12. Additionally, the vacuum biasing scheme embodied in this invention compliments this improved magnetic flux concentration by insuring that none of the chips are disturbed after magnetic alignment occurs.

What is claimed is:

1. An apparatus for automatically magnetically aligning a plurality of integrally leaded semiconductor device chips simultaneously with a conductive lead frame structure for bonding thereto, wherein the apparatus includes a soft ferromagnetic elongated vertically extending support member, means surrounding said support member for supplying a magnetic field thereto, means for successively vertically raising said support member, and means on the upper part of said support member for receiving a probe holding device, wherein the improvement comprises:

a probe holding device having a plurality of soft ferromagnetic cylinder members each having a tapered upper end portion, a web interconnecting said cylinder members, a nonferromagnetic portion in said web between each of said cylinder members having at least substantially the same height and thickness as said web, said nonferromagnetic portion providing means for dividing magnetic flux from said support member and uniformly concentrating them in said cylinder members, a cylindrical chamber in each of said cylinder members, a vertical bore extending from the tapered upper end portion of each cylinder member down to the top of each of said chambers, a vacuum port in the upper portion of each of said chambers, a source of vacuum, means for communicating said source of vacuum with each of said ports, an opening in the bottom of each of said chambers for exposing the lower portion of said chambers to atmospheric pressure, an elongated soft ferromagnetic probe in each of said bores, said probe being longer than said bore and having upper and lower ends, the upper end of said probe extending upwardly above said cylinder member and said lower end of said probe extending into said chamber, said probe having a transverse dimension slightly smaller than the corresponding transverse dimension of said bore wherein ambient air can be drawn into the upper portion of said chamber by said vacuum to produce an air-bearing effect between said probe and said bore, each of said probes being tapered at its upper end for easy insertion into a chip carrying apparatus and for further concentrating said magnetic flux, and a nonferromagnetic collar on the lower end of each of said probes below said vacuum port providing an enlarged surface for said probes wherein air drawn into said chambers through each of said chamber bottom openings upwardly biases said probes so that they may each simultaneously carry a chip into more precise automatic magnetic alignment with an overlying lead frame structure for bonding.

2. An apparatus for automatically magnetically aligning a plurality of integrally leaded semiconductor device chips simultaneously with a conductive lead frame structure for bonding thereto wherein the apparatus includes a soft ferromagnetic elongated vertically extending support member, means surrounding said support member for supplying a magnetic field thereto, means for successively vertically raising said support member, and means on the upper part of said support member for receiving a probe holding device, wherein the improvement comprises:

a probe holding device having two soft ferromagnetic cylinder members each having a tapered upper end portion, a web interconnecting said cylinder members, said web being mounted on said receiving means on the upper part of said support member so that each cylinder member is spaced about the said distance from said support member, a brass portion centrally located in said web between each of said cylinder members having substantially the same height and thickness as said web, a cylindrical chamber in each of said cylinder members, a vertical bore extending from the tapered upper end portion of each cylinder member down to the top of each of said chambers, a vacuum port in the upper onefourth portion of each of said chambers, a source of vacuum, means for communicating said source of vacuum with each of said ports, an opening in the bottom of each of said chambers exposing the lower portion of said chambers to atmospheric pressure, an elongated soft ferromagnetic probe in each of said bores, said probe being longer than said bore and having upper and lower ends, the upper end of said probe extending upwardly above said cylinder member and said lower end of said probe extending into said chamber, said probe having a transverse dimension slightly smaller than the corresponding transverse dimension of said bore wherein ambient air can be drawn into the upper portion of said chamber by said vacuum to produce an air-bearing effect between said probe and said bore, said probes being spaced a predetermined distance from one another, said brass portion in said web having a length of about 13 – 50% of said predetermined distance between said probes wherein magnetic flux from said support member is uniformly concentrated in each of said cylinder members and probes to promote better chip-lead frame alignment, each of said probes being tapered at its upper end for easy insertion into a chip carrying apparatus and for further concentrating said magnetic flux, and a brass collar press-fit on the lower end of each of said probes below said vacuum port providing an enlarged piston-like surface for said probes wherein air drawn into said chambers through said chamber bottom openings upwardly biases said probes so that they may each simultaneously carry a chip into more precise automatic magnetic alignment with an overlying lead frame structure for bonding.

* * * * *